United States Patent
Goto et al.

(10) Patent No.: US 7,325,511 B2
(45) Date of Patent: Feb. 5, 2008

(54) MICROWAVE PLASMA PROCESSING APPARATUS, MICROWAVE PROCESSING METHOD AND MICROWAVE FEEDING APPARATUS

(75) Inventors: Naohisa Goto, 8-1, Shiroyamate 2-chome, Hachioji-shi, Tokyo (JP) 190-0825; Tadahiro Ohmi, 1-17-301, Komegafukuro 2-chome Aoba-ku, Sendai-shi, Miyagi (JP) 980-0813; Masaki Hirayama, Sendai (JP); Tetsuya Goto, Sendai (JP)

(73) Assignees: Naohisa Goto, Hachioji (JP); Tadahiro Ohmi, Sendai (JP); Tokyo Electron Limited, Tokyo (JP)

( * ) Notice: Subject to any disclaimer, the term of this patent is extended or adjusted under 35 U.S.C. 154(b) by 261 days.

(21) Appl. No.: 10/450,149

(22) PCT Filed: Oct. 18, 2002

(86) PCT No.: PCT/JP02/10847

§ 371 (c)(1),
(2), (4) Date: Jun. 11, 2003

(87) PCT Pub. No.: WO03/036700

PCT Pub. Date: May 1, 2003

(65) Prior Publication Data
US 2004/0026039 A1 Feb. 12, 2004

(30) Foreign Application Priority Data
Oct. 19, 2001 (JP) .............................. 2001-322529

(51) Int. Cl.
*C23C 16/00* (2006.01)
*C23F 1/00* (2006.01)
*H01L 21/306* (2006.01)

(52) U.S. Cl. ........................ 118/723 MW; 156/345.36; 156/345.41; 156/345.46; 156/345.49

(58) Field of Classification Search ........... 156/345.36, 156/345.41; 118/723 MW
See application file for complete search history.

(56) References Cited

U.S. PATENT DOCUMENTS 4,776,918 A * 10/1988 Otsubo et al. ......... 156/345.41
5,276,386 A * 1/1994 Watanabe et al. ....... 315/111.21

(Continued)

FOREIGN PATENT DOCUMENTS

CN 440051 7/2001

(Continued)

OTHER PUBLICATIONS

European Search Report dated Aug. 5, 2005 (Three (3) pages).

(Continued)

*Primary Examiner*—Parvis Hassanzadeh
*Assistant Examiner*—Rakesh K. Dhingra
(74) *Attorney, Agent, or Firm*—Crowell & Moring LLP

(57) ABSTRACT

A microwave plasma processing apparatus includes a processing vessel, a microwave generator, a waveguide guiding a microwave formed by the microwave generator, and a microwave emitting member emitting the microwave with wavelength compression by a retardation plate, wherein the waveguide has a single microwave output opening in a location corresponding to a central par of the microwave emitting member.

29 Claims, 12 Drawing Sheets

U.S. PATENT DOCUMENTS

| | | | |
|---|---|---|---|
| 5,364,519 A * | 11/1994 | Fujimura et al. | 204/298.38 |
| 5,698,036 A * | 12/1997 | Ishii et al. | 118/723 MW |
| 6,290,807 B1 | 9/2001 | Matsumoto et al. | 156/345 |
| 6,322,662 B1 * | 11/2001 | Ishii et al. | 156/345.41 |
| 6,343,565 B1 * | 2/2002 | Hongoh | 118/723 MW |
| 6,347,602 B2 * | 2/2002 | Goto et al. | 118/723 MW |
| 6,607,633 B2 * | 8/2003 | Noguchi | 156/345.41 |
| 6,736,930 B1 * | 5/2004 | Hongoh | 156/345.41 |
| 2002/0066536 A1 * | 6/2002 | Hongoh et al. | 156/345.41 |

FOREIGN PATENT DOCUMENTS

| | | |
|---|---|---|
| EP | 0 791 949 A2 | 8/1997 |
| JP | 5-78849 | 3/1993 |
| JP | 5-343194 A | 12/1993 |
| JP | 7-142196 | 6/1995 |
| JP | 11-67492 | 3/1999 |
| JP | 11-111495 | 4/1999 |
| JP | 11354294 A * | 12/1999 |
| JP | 2000-77335 | 3/2000 |
| JP | 2000-223298 A * | 8/2000 |
| JP | 2001-167900 A | 6/2001 |

OTHER PUBLICATIONS

Japan Office Action dated Oct. 16, 2007 (Two (2) pages).

* cited by examiner $LA-LB = \lambda/4$

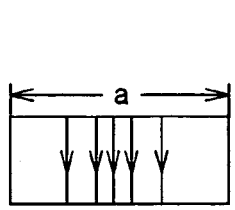
FIG.6A
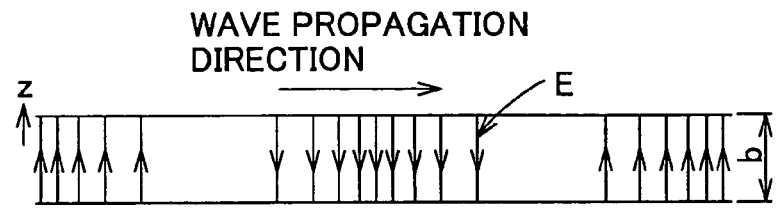
FIG.6B
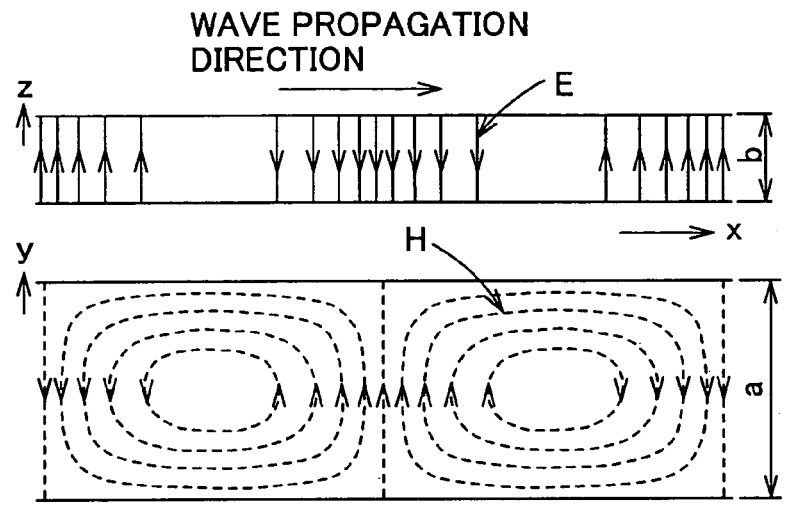
FIG.6C
FIG.7
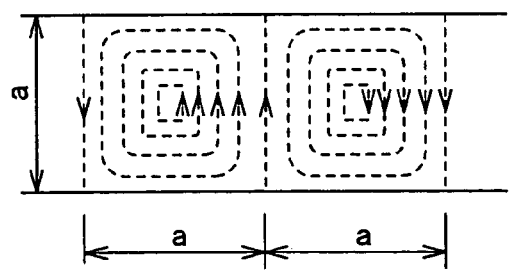

CIRCULAR WAVE GUIDE
TM01 MODE

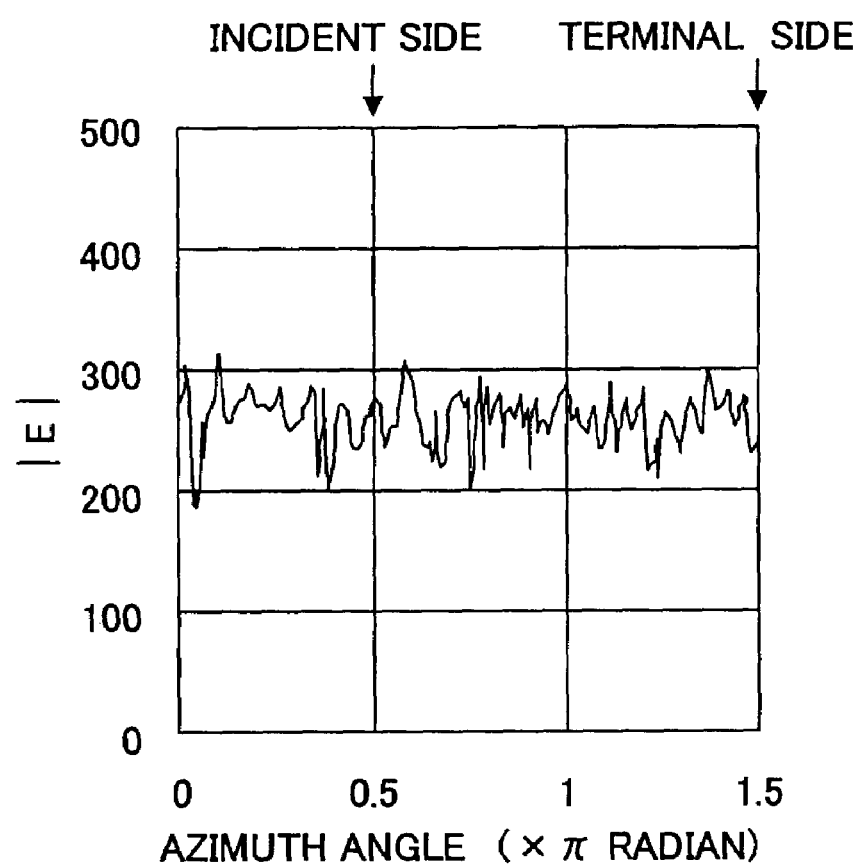

MICROWAVE PLASMA PROCESSING APPARATUS, MICROWAVE PROCESSING METHOD AND MICROWAVE FEEDING APPARATUS

TECHNICAL FIELD

The present invention relates to plasma processing apparatuses and more particularly to a microwave plasma processing apparatus that generates plasma by a microwave and conducts plasma processing on a semiconductor wafer, and the like.

BACKGROUND ART

Plasma processing apparatuses are used in these days in the fabrication process of semiconductor devices, in view of increase of integration density and increased degree of device miniaturization, for film formation, etching, ashing, and the like. Particularly, a microwave plasma processing apparatus that induces plasma by using microwave has an advantage of generating stable plasma even in a high vacuum state of relatively low pressure, such as 0.1—several 10 mTorrs. Because of this, a microwave plasma processing apparatus that uses a microwave such as 2.45 GHz now draws attention.

In the microwave plasma-processing apparatus, there is provided a dielectric plate transparent to microwave on a ceiling part of a processing vessel, while the processing vessel is connected to a general evacuation system. Further, a flat, disk-like antenna member (microwave-emitting member) is provided on the dielectric plate.

Further, a retardation plate is provided on the antenna member. The retardation plate is formed of a dielectric film having a predetermined dielectric constant and compresses the wavelength of the microwave supplied thereto from a microwave generator with a predetermined ratio. The antenna member is formed with a number of penetrating holes (slots) and the microwave supplied to the central part of the antenna member is introduced into the processing vessel through the slots after propagating inside the antenna member in the radial direction thereof. As a result of the compression of the wavelength of the microwave supplied to the antenna member by the retardation plate, the size of the slots formed in the antenna member is reduced, and as a result, the uniformity of plasma density is improved by providing a large number of slots on the antenna member.

In the microwave plasma processing apparatus of such a construction, the microwave introduced into the processing vessel from the antenna member via the dielectric place induces plasma of a processing gas, and the semiconductor wafer disposed in the processing vessel is subjected to plasma processing.

The microwave introduced into the processing vessel via the retardation plate and the antenna member is supplied from a microwave generator such as a magnetron, or the like. The microwave generated by the microwave generator is supplied to the retardation plate or to the antenna member via a waveguide. The microwave thus guided through the waveguide is emitted as it is propagated through the antenna member in the radial direction thereof from the central part. Ultimately, the microwave is emitted uniformly into a process space inside the processing vessel.

A coaxial waveguide has been used generally for supplying the microwave to the central part of the retardation plate or the antenna member. Thus, the microwave generated by the microwave generator is supplied to a waveguide having a rectangular cross section and is propagated therethrough to the part generally at the center of the retardation plate or the antenna member. There, the microwave is supplied into the central part of the retardation plate or the antenna member via the coaxial waveguide formed of an inner conductor and an outer conductor.

The coaxial waveguide that supplies the microwave to the central part of the retardation plate or the antenna member is formed for example of an inner conductor and an outer conductor, wherein the inner conductor is formed of a thin tube having a diameter of about 17 mm.

Thus, in the case large electric power is to be supplied to the antenna member via the coaxial waveguide, there is induced a very strong electric field in the vicinity of the inner conductor of the coaxial waveguide, and the temperature of the inner conductor is raised as a result of heating. There, a part of the microwave energy is converted to heat, while such conversion of microwave energy to heat increases the loss (conductor loss) of the supplied microwave. Thereby, the efficiency of electric power feeding is deteriorated. Further, there arises the need of cooling the coaxial waveguide by covering the same by a cooling device, while such a construction increases the size and cost of the apparatus.

Further, because of the existence of very strong electric field in the vicinity of the inner conductor, there is a possibility that abnormal electric discharge may be caused in the vicinity of the inner conductor. When such abnormal electric discharge is caused, the retardation plate may be damaged in the part thereof near the inner conductor.

For example, there is a need of connecting the inner conductor of the coaxial waveguide to the antenna member in the state that the coaxial waveguide makes an intimate contact with the central part of the antenna member, and because of this, it is practiced to connect the inner conductor to the antenna member by screwing a screw into a threaded hole provided inside the inner conductor through the retardation plate in the state the end surface makes a contact with the antenna member. With such a connection that uses a screw, however, it is difficult to achieve complete and intimate contact of the inner conductor end surface to the surface of the antenna member. When there is a minute gap, on the other hand, there tends to occur abnormal electric discharge in such a part.

Further, in the screwed connection explained above, there exists a screw head at the junction part where the dielectric plate and the antenna member (slot antenna) are joined. Thus, there is a need of forming a depression in the dielectric plate at the central part thereof for accommodating therein the screw head projecting from the surface of the slot antenna. Thus, it is difficult to achieve an intimate connection between the retardation plate and the antenna member at the central part, and there arises the problem that abnormal electric discharge takes place in the vicinity of such a depression.

Further, there can be a case in which it is desired to confine a helium (He) gas between the antenna member or the retardation plate and the top plate formed of a dielectric material, for facilitating thermal conduction. In such a case, there is provided a seal ring at the outer periphery of the inner conductor constituting the coaxial waveguide for achieving sealing with respect to the dielectric top plate. In such a case, however, there arises a problem in that the seal ring may be damaged as a result of degradation caused by the exposure to the strong microwave.

Thus, there is a proposal to provide a cavity resonator between the waveguide and the antenna member and introduce the microwave into the processing vessel from the cavity resonator. The Patent Japanese Patent 2,569,019 discloses the technology of providing such a cavity resonator in the waveguide for amplifying the microwave. In this technology, the microwave thus amplified is introduced into the processing vessel through a number of slots formed on the bottom surface of the cavity resonator. Thus, the cavity resonator disclosed in this patent publication is formed with a number of slots on the entire bottom surface thereof so that there occurs emission of the microwave from the entire bottom surface facing the processing vessel. Therefore, the foregoing prior art does not have the construction of causing radial propagation of the microwave from the central part when emitting the microwave into the processing space of the processing vessel. Further, it should be noted that the length of each slot is determined by the wavelength of the microwave. In the case of using the microwave of 2.45 GHz, the slot desirably has the length of 60 mm or more in correspondence to the half wavelength of the microwave. This means that the construction of the reference does not provide the desirable effect of the microwave propagated in the radial direction from the central part is emitted uniformly into the processing vessel from a number of minute slots. Thus, it is not possible to apply the microwave supplying mechanism (feeding mechanism) having a cavity resonator as is disclosed in the foregoing Patent Japanese Patent 2,569,019 to the antenna member (slot antenna) that supplied the microwave uniformly to the processing vessel from a number of minute slots.

DISCLOSURE OF THE INVENTION

Accordingly, it is a general object of the present invention to provide a novel and useful microwave plasma processing apparatus and processing method wherein the foregoing problems are eliminated.

Another and more specific object of the present invention is to provide a microwave plasma processing apparatus and microwave plasma processing method as well as a microwave feeding mechanism wherein the microwave supplied from a microwave generator is supplied efficiently to an antenna member from a waveguide.

Another object of the present invention is to provide a microwave plasma processing apparatus for applying plasma processing on a substrate, characterized by:
 a processing vessel accommodating therein a stage for supporting the substrate;
 a microwave generator;
 a waveguide connected to said microwave generator, said waveguide guiding a microwave generated by the microwave generator; and
 a microwave emitting member emitting the microwave into a space in the processing vessel after wavelength compression by a retardation plate,
 the waveguide has a single microwave outlet opening in a location corresponding to a center of the microwave emitting member.

Another object of the present invention is to provide a microwave plasma processing method for applying plasma processing on a substrate, comprising the steps of:
 placing the substrate to be processed on a stage inside a processing vessel;
 generating a microwave by a microwave generator;
 guiding the microwave generated by the microwave generator by a waveguide connected to the microwave generator;
 outputting the microwave supplied from the waveguide connected to the microwave generator, from a single microwave outlet opening;
 emitting the microwave outputted from the waveguide connected to the microwave generator into a space inside the processing vessel by a microwave-emitting member; and
 applying plasma processing on the substrate by forming plasma by the emitted microwave.

Another object of the present invention is to provide a microwave feeding apparatus for supplying a microwave to a processing chamber, comprising:
 a waveguide connected to a microwave generator, the waveguide guiding a microwave generated by the microwave generator, the waveguide having a microwave outlet opening for outputting the microwave; and
 a microwave-emitting member causing the microwave supplied to a central part thereof to propagate in a direction perpendicular to a direction in which the microwave is supplied, the microwave-emitting member introducing the microwave into the processing chamber via a number of slots.

According to the present invention, the microwave is supplied to the central part of the microwave-emitting member via the single microwave output opening provided in the waveguide, which is connected to the microwave generator, and the microwave thus supplied is caused to propagate through the microwave-emitting member in the radial direction thereof from the central part. As a result, the microwave is emitted efficiently and uniformly into the processing vessel from the number of slots formed in the microwave-emitting member, and there occurs uniform plasma formation. Thus, according to the present invention, it becomes possible to supply the microwave to the microwave-emitting member without using a coaxial waveguide, and the problem of electric power loss caused in the coaxial waveguide by the inner conductor is eliminated. Thereby, the efficiency of power feeding is improved. Further, the number of the sites where there is caused concentration of the microwave is reduced, and occurrence of unnecessary electric discharge at the feeding part is suppressed. As a result, it becomes possible to supply a large electric power to the microwave-emitting member. Further, the screw connection part for connecting the inner conductor of the coaxial waveguide is no longer used, and the shape of the microwave emission part is simplified. With this, it becomes possible to confine a heat conducting gas such as helium, and the like, easily.

Further, by constructing a cavity resonator by providing another waveguide between the waveguide connected to the microwave generator and the microwave-emitting member, reflection of the microwave supplied to the cavity resonator is prevented, and substantially the entirety of the microwave energy is introduced into the microwave-emitting member from the microwave outlet opening formed in the foregoing another waveguide. As a result, the risk of electric discharge at the connection part, as in the case of feeding electric power by a coaxial waveguide, is eliminated, and it becomes possible to supply a large electric power efficiently, without causing electric power loss by heating.

BRIEF DESCRIPTION OF THE DRAWINGS

FIGS. 6A-6C are diagrams showing the propagation mode microwave in a rectangular waveguide;

FIG. 7 is a diagram showing the magnetic field caused by the microwave propagating in the rectangular waveguide;

FIG. 15 is a graph showing the electric field strength distribution at the microwave outlet opening of the third embodiment of the present invention in the circumferential direction.

BEST MODE FOR IMPLEMENTING THE INVENTION

Next, various mode of implementing the present invention will be explained with reference to the drawings.

(First Embodiment)

Figure 1:
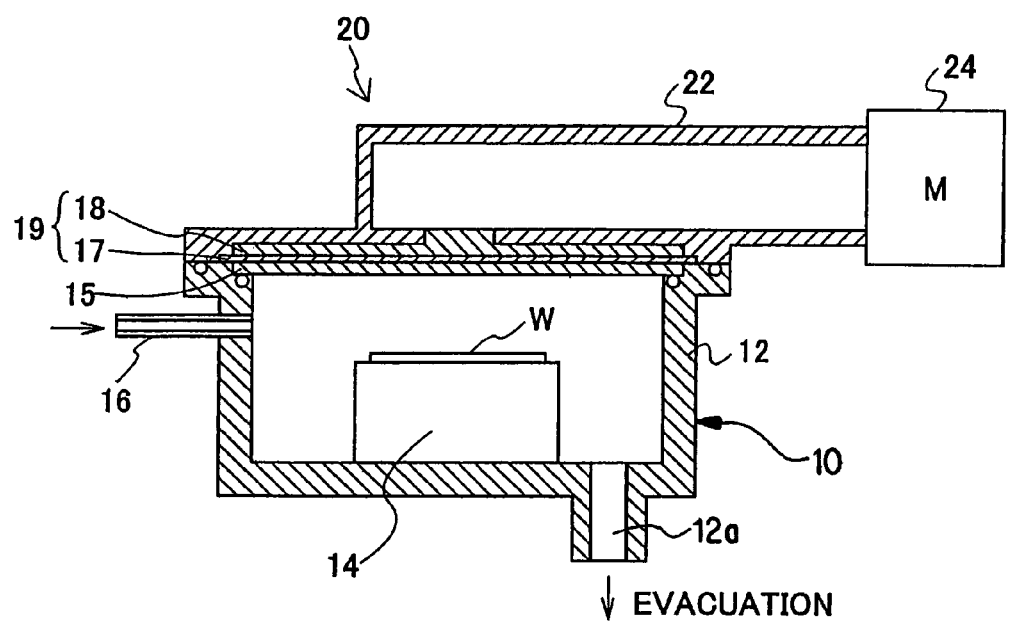
FIG. 1 is a cross sectional diagram showing the general construction of a microwave plasma processing apparatus according to a first embodiment of the present invention.

FIG. 1 is a cross sectional view showing the general construction of a microwave plasma processing apparatus according to a first embodiment of the present invention.

As represented in FIG. 1, the microwave plasma processing apparatus according to the first embodiment of the present invention is a plasma CVD apparatus 10 that applies plasma CVD processing on a semiconductor wafer W in a processing vessel 12. It should be noted that the present invention is not limited to such a plasma processing apparatus but is applicable also to the apparatus that applies a plasma process such as plasma ashing, plasma etching, plasma oxidation or oxynitridation or nitridation.

The semiconductor wafer W to be processed is placed on a stage 14 inside the processing vessel 12, and a plasma processing gas is supplied to the processing vessel 12 from a gas source (not shown) via a supply tube 16. On the other hand, there is provided an evacuation port 12a at the bottom part of the processing vessel 12 in connection to a vacuum pump (not shown), and the pressure inside the processing vessel is maintained at a predetermined evacuated pressure.

Next, the construction of a microwave feeding apparatus used for introducing a microwave into the processing vessel 12 will be explained with reference to FIG. 1 and also FIG. 2.

Figure 2:
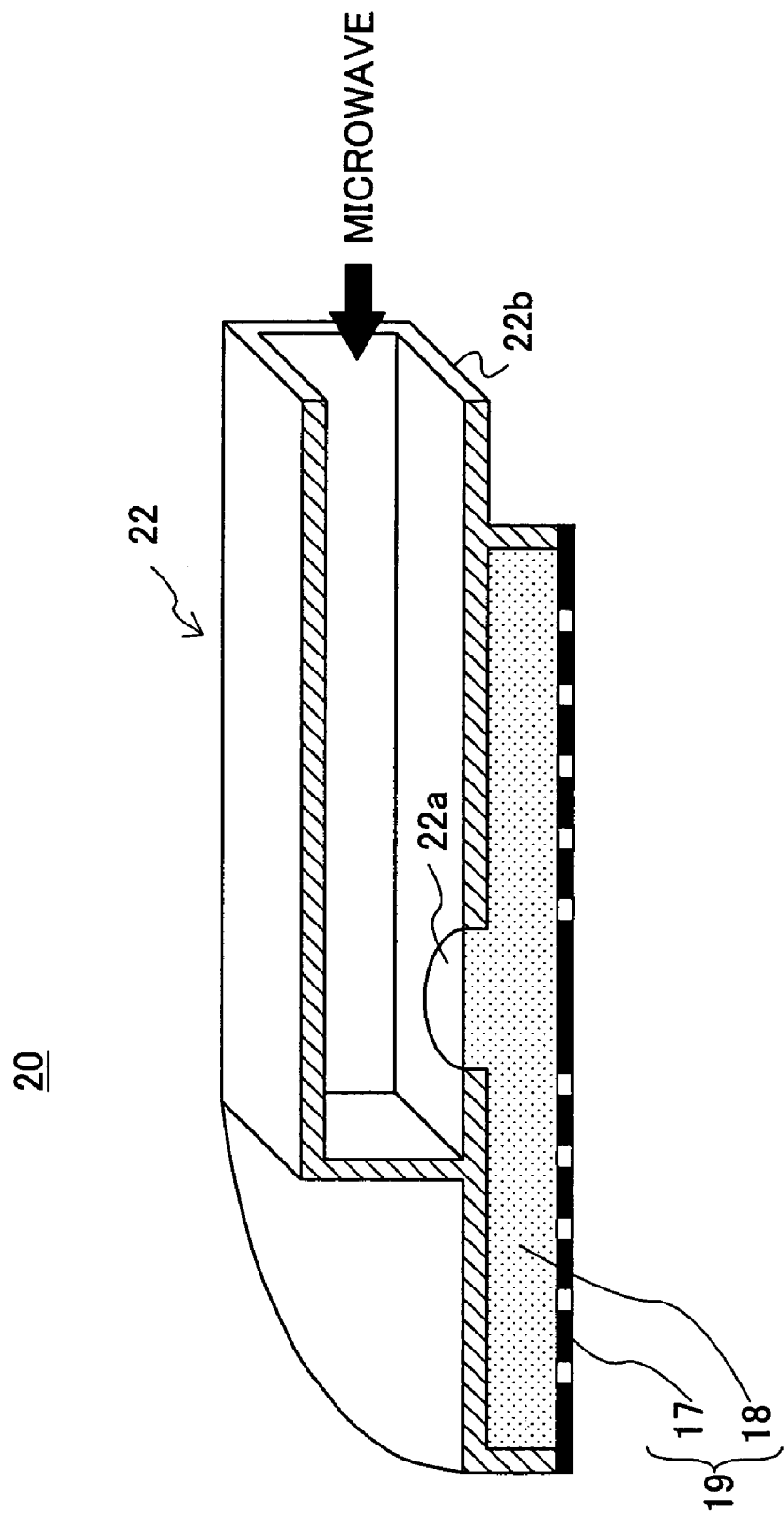
FIG. 2 is an oblique view showing the cross section of a microwave feeding apparatus constituting a part of the microwave plasma processing apparatus of FIG. 1 for introducing microwave into a processing vessel.

FIG. 2 is an oblique view showing the cross section of a microwave feeding apparatus 20 used in the plasma CVD apparatus 10 of FIG. 1 for introducing the microwave into the processing vessel 12.

It should be noted that the ceiling part of the processing vessel 12 is opened, and a microwave emitting member 19, formed of an antenna member (slot plate) 17 functioning as the microwave-emitting member and a retardation plate 18, is mounted on the foregoing opening via a dielectric plate 15 in an air tight state. The retardation plate 18 is the member for compressing the wavelength of the microwave supplied to the antenna member 17 and is provided for reducing the length and also the interval of the slots formed on the antenna member 17. Above the retardation plate 18, there is provided a rectangular waveguide (first waveguide) 22 having a rectangular cross section, and a microwave generator 24 such as a magnetron, or the like, is provided at an end of the rectangular waveguide 22. Thus, the microwave of 2.45 GHz for example, generated by the microwave generator 24, is propagated through the rectangular waveguide 22 and is supplied to the microwave-emitting member 19 from a microwave outlet opening 22a provided at the other end of the rectangular waveguide 22. In the present embodiment, it should be noted that the microwave outlet opening 22a is a circular opening provided in a wall 22b of the rectangular waveguide 22 constituting a longer edge in the cross section and is disposed at the central part of the antenna member 17 located underneath thereof.

Figure 3:
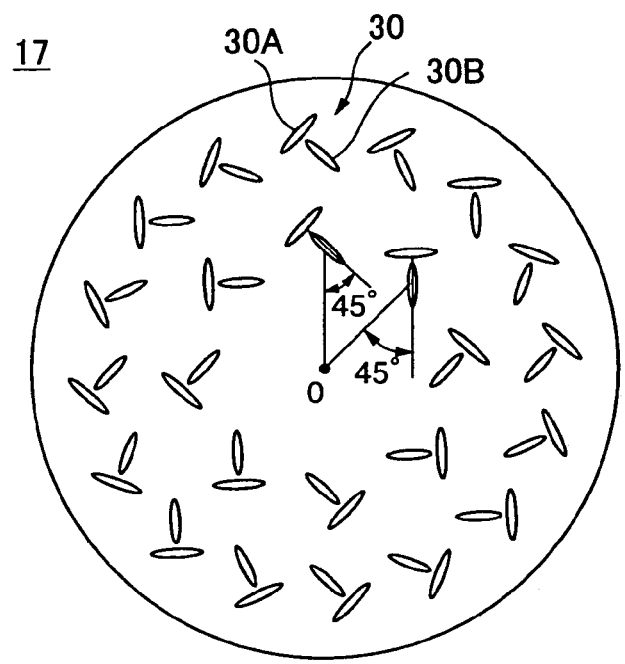
FIG. 3 is a plan view showing an example of an antenna member shown in FIG. 2.

FIG. 3 is a plan view showing an example of the antenna member 17. The antenna member 17 of FIG. 3 is formed with a number of slot pairs 30 formed of a slot 30A and a slot 30B. In the example illustrated in FIG. 3, the slot pairs 30 are disposed along a plurality of concentric circles, while it is possible that the slot pairs are arranged in a spiral pattern or non-concentric pattern.

Figure 4:
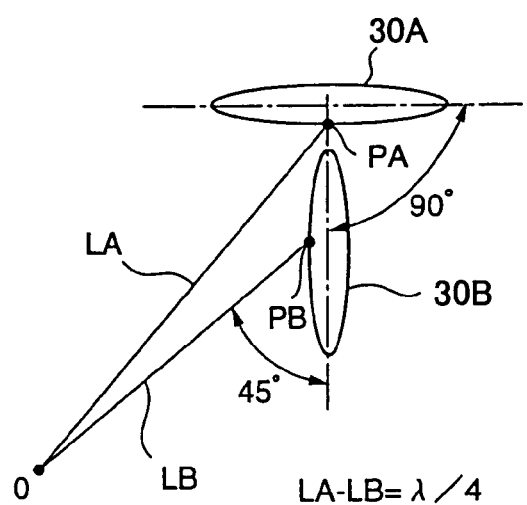
FIG. 4 is a diagram showing the construction of a slot pair shown in FIG. 3.

FIG. 4 shows the construction of a slot pair shown in FIG. 3. Each of the slots 30A and 30B has an elongated elliptical shape having a bulging central part, wherein the slot 30B is arranged such that the longitudinal direction thereof from a 90 degree angle with regard to the elongating direction of the slot 30A and the slots 30A and 30B are disposed in a T-shaped form such that an end of the slot 30B is located close to the central part of the slot 30A. The line connecting the center of the slot 30B and the center O of the antenna member 17 forms an angle of 45 degrees with regard to the elongating direction of the slot 30B. Further, the distance LA from the center of the slot 30A to the center 0 of the antenna member 17 and the distance LB from the center of the slot 30B to the center of the antenna member 17 are determined such that a difference (LA-LB) is equal to one-quarter of the microwave wavelength λcompressed by the retardation plate 18 ((LA-LB) =λ/4).

In the case a microwave is caused to propagate through the antenna member 17 having the slot pairs 30 explained above in the radial direction from the central part, there is caused an electric field of circular polarization by the slot pairs 30 and the microwave is emitted efficiently into the process space inside the processing vessel 12 uniformly.

It should be noted that the slots forming the antenna member 17 are not limited to the one that forms the slot pairs. Further, each of the slots is not limited to have the elongated elliptical shape. For example, the slots may have a circular form, triangular form, square form, rectangular form, or any other polygonal form. It is desirable, however, to provide a rounded smooth corner, in the case the slots are formed in a polygonal shape, for avoiding occurrence of abnormal discharge caused by concentration of electric field.

Figure 5:
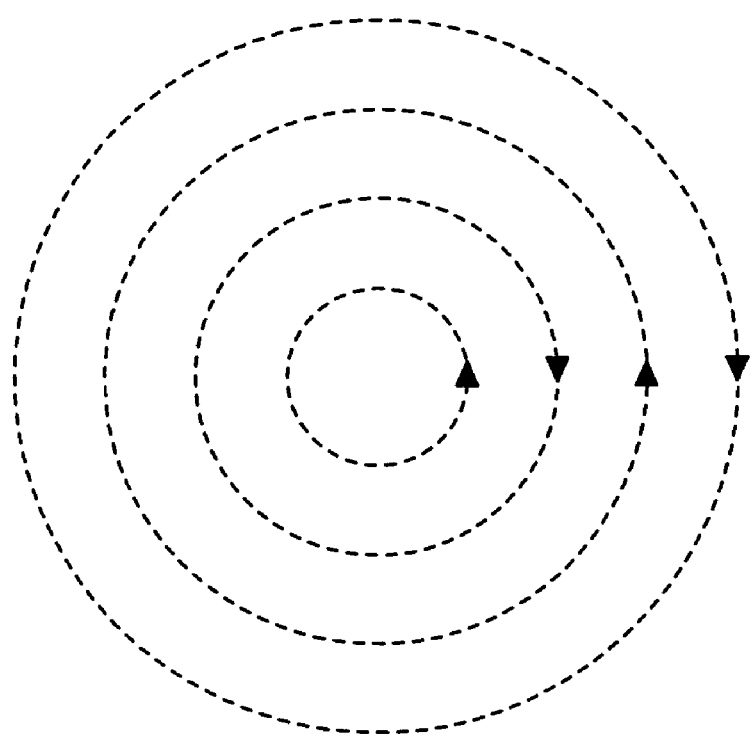
FIG. 5 is a diagram showing the propagation mode of microwave in the microwave-emitting member.

As noted above, the microwave is propagated in TEM mode in the antenna member 17, in which the microwave propagates in the radial direction, wherein TEM mode has a concentric magnetic field distribution within a radial line as represented in FIG. 5. Thus, it is preferable that the microwave supplied from the rectangular waveguide 22 to the antenna member 17 (retardation plate 18) has a magnetic field distribution close to the concentric distribution as much as possible.

Thus, in the present embodiment, various dimensions of the rectangular waveguide 22 are adjusted such that the microwave propagating through the rectangular waveguide has a magnetic field distribution as close to a circle as possible.

FIGS. 6A-6C are diagrams showing the propagation mode of the microwave in the rectangular waveguide 22. Here, it should be noted that FIG. 6A shows the electric flux lines in the cross section perpendicular to the propagating direction of the microwave in the rectangular waveguide 22, while FIG. 6B shows the electric flux lines in the cross section parallel to the propagating direction of the microwave in the rectangular waveguide 22. Further, FIG. 6C shows the magnetic lines occurring in the plane perpendicular to the electric flux line. In the cross section of FIG. 6A, it should be noted that the longer edge has a length a while the shorter edge has a length b.

It should be noted that the propagation mode of the microwave in the rectangular waveguide is TE10 mode, in which the magnetic field formed in the region defined by the longer edge a in the cross section of the rectangular waveguide and ½ of the wavelength $\lambda g$ inside the waveguide propagates in the propagating direction (x direction) of the microwave. In order to modify the magnetic field distribution shown in FIG. 6C to be close to the magnetic field distribution of FIG. 5, it will be noted that formation of the magnetic field in a square region as shown in FIG. 7 would be effective, by setting the length $\lambda g/2$ to be equal to the longer edge a ($\lambda g=2a$).

The wavelength $\lambda g$ inside the waveguide can be represented by $$\lambda g = \lambda / [1-(\lambda/2a)^2]^{1/2}$$

Thus, by substituting the relationship $\lambda g=2a$, it becomes possible to obtain the optimum length of the longer edge a. For the case of the microwave of 2.45 GHz wavelength, the optimum length of the edge a is calculated as a=86.6 mm.

Figures 8A, 8B:
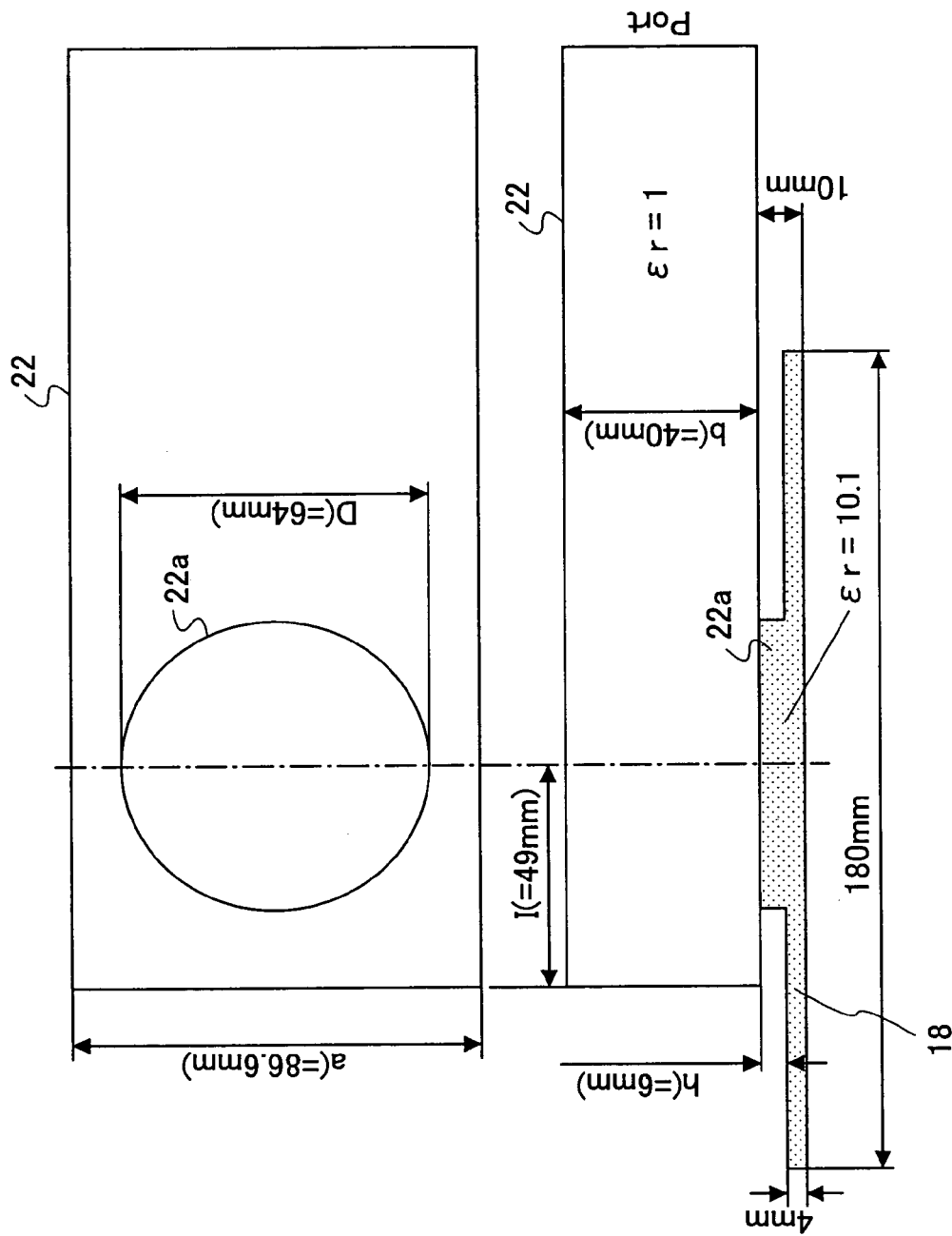
FIGS. 8A and 8B are diagrams showing the result of calculation of optimum size for each of the rectangular waveguide and the microwave outlet opening.

FIGS. 8A and 8B are diagrams showing the result of calculation of various optimum values of the rectangular waveguide 22 and the microwave outlet opening 22a. Here, it is assumed that the longer edge a of the cross section of the waveguide 22 has the length of 86.6 mm as noted above, while the length of the shorter edge b is set to 40 mm. Further, the diameter D of the microwave outlet opening 22a is set to 64 mm.

Further, it was assumed that the distance h between the retardation plate 18 and the waveguide 22 is 6 mm and a part of the retardation plate 18 projects onto the microwave outlet opening 22a. The diameter of the retardation plate 18 is set to 180 mm and the thickness is set to 4 mm. Further, it should be noted that the results shown below does not change even when the diameter of the retardation plate 18 is 180 mm or more. Further, the dielectric constant $\epsilon r$ of the retardation plate 18 is set to 10.1. Here, the reflection of the microwave feed from the microwave outlet opening 22a is evaluated while changing the distance I from the center of the microwave outlet opening 22a and the edge of the rectangular waveguide 22.

Figure 9:
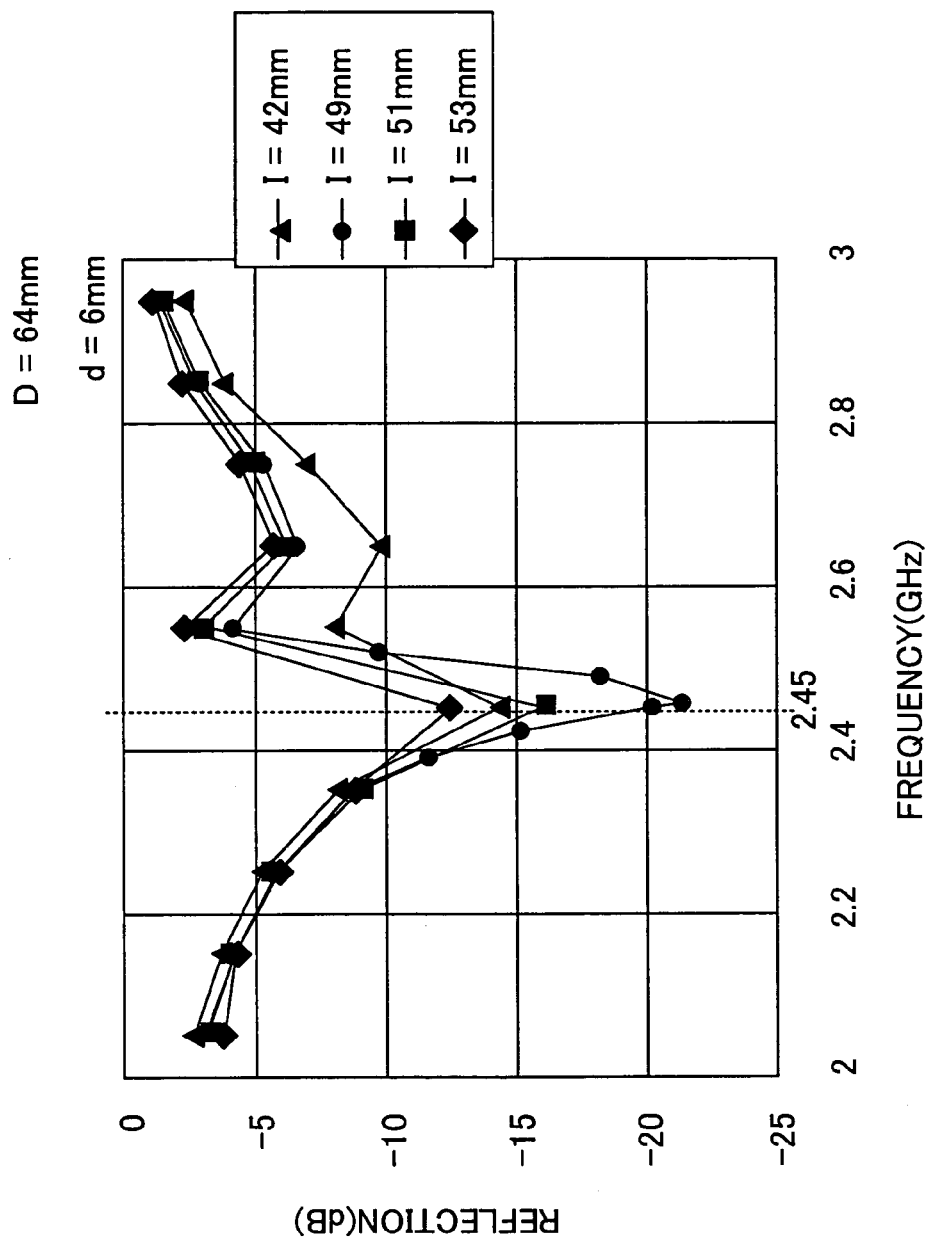
FIG. 9 is a graph showing the result of simulation of microwave reflectance at the microwave outlet opening.

FIG. 9 shows the graph showing the result of simulation conducted on the reflectance of the microwave for the case the distance I is changed. From the graph of FIG. 9, it can be seen that the reflectance becomes minimum in the case the distance I is 49 mm when the microwave has the frequency of 2.45 GHz.

As explained above, the reflectance of the feeding part becomes −20 dB or less in the case the frequency of the microwave is set to 2.45 GHz and various parts of the waveguide 22 are set such that the longer edge of the cross section is 86.6 mm, the shorter edge b is 40 mm, the diameter D of the microwave outlet opening 22a is 64 mm and the thickness (length) h of the microwave outlet opening 22a is 6 mm. In this case, the reflection of the microwave at the feeding part is suppressed to 1% or less, and efficient introduction of the microwave becomes possible from the rectangular waveguide 22 to the microwave emission part 19.

In the plasma CVD apparatus 10 of the construction noted above, the microwave generated by the microwave generator 24 propagates through the waveguide 22 and is introduced into the retardation plate 18 via the microwave outlet opening 22a. The microwave thus introduced to the central part of the retardation plate 18 propagates in the radial direction while experiencing wavelength compression and is emitted into the process space inside the processing vessel 12 via the slot pairs 30 provided in the antenna member 17 with a large number. Thereby, uniform plasma is formed in the process space and a uniform plasma processing is conducted on the semiconductor wafer W.

As noted heretofore, the plasma CVD apparatus 10 of the present embodiment can feed a large electric power to the microwave-emitting member 19 directly from the rectangular waveguide 22 via the microwave outlet opening 22a, without using a coaxial waveguide. In such a construction, there occurs no microwave loss (conductor loss) caused by the inner conductor of the coaxial waveguide, and deterioration of efficiency of electric power feeding does not take place. Thereby, it becomes possible to reduce the manufacturing cost of the apparatus without increasing the size of the apparatus.

Further, because of the elimination of the inner conductor of the coaxial waveguide, the present invention can eliminate the abnormal electric discharge, which tends to take place in the vicinity of the inner conductor. Thus, the problem of damaging of the retardation plate caused by the shock of abnormal electric discharge, which tends to occur when the microwave is supplied to the antenna member via the retardation plate, is prevented.

Further, because the screw connection used for connecting the inner conductor of the coaxial waveguide is no longer necessary, it becomes possible to eliminate the gap formed between the inner conductor and the antenna member. Thereby, the problem of electric discharge, which takes place in such a gap, is successfully eliminated.

Further, in the case a conventional coaxial waveguide is used, it is no longer necessary in the screw connection approach explained above to form the depression in the central part of the antenna member at the junction part of the retardation plate and the antenna member for accommodating the screw head. Thus, the retardation plate and the antenna member are intimately contacted for the entire part thereof, and the problem of occurrence of abnormal electric discharge between the retardation plate and the antenna member is eliminated.

Further, there are cases in which it is desirable to confine a helium (He) gas between the antenna member or the retardation plate and the top plate formed of a dielectric material for enhancing thermal conduction. In this case, it is no longer necessary to achieve sealing by providing a seal ring around the periphery of the inner conductor, and the problem of deterioration of the seal ring by the microwave no longer occurs.

(Second Embodiment)

Next, a second embodiment of the present invention will be described. The microwave plasma processing apparatus according to the second embodiment of the present invention has a fundamental structure identical with that of the plasma CVD apparatus shown in FIG. 1. Thus, only the microwave feeding apparatus will be explained hereinafter.

First, explanation will be made on the symmetry of the microwave introduced into the microwave emitting member from the microwave feeding apparatus 20 of the plasma CVD apparatus according to the first embodiment will be explained.

In the microwave feeding apparatus 20, the microwave propagating from one side of the microwave outlet opening 22a undergoes a change of propagation direction at the microwave outlet opening 22a to the perpendicular direction and is emitted toward the retardation plate 18. Thereby, it should be noted that the electric field strength of the microwave becomes stronger in the microwave outlet opening 22a at the side of the propagating direction of the microwave as compared with the electric field strength at the opposite side, and there appears non-uniform distribution of the microwave power.

Figure 10:
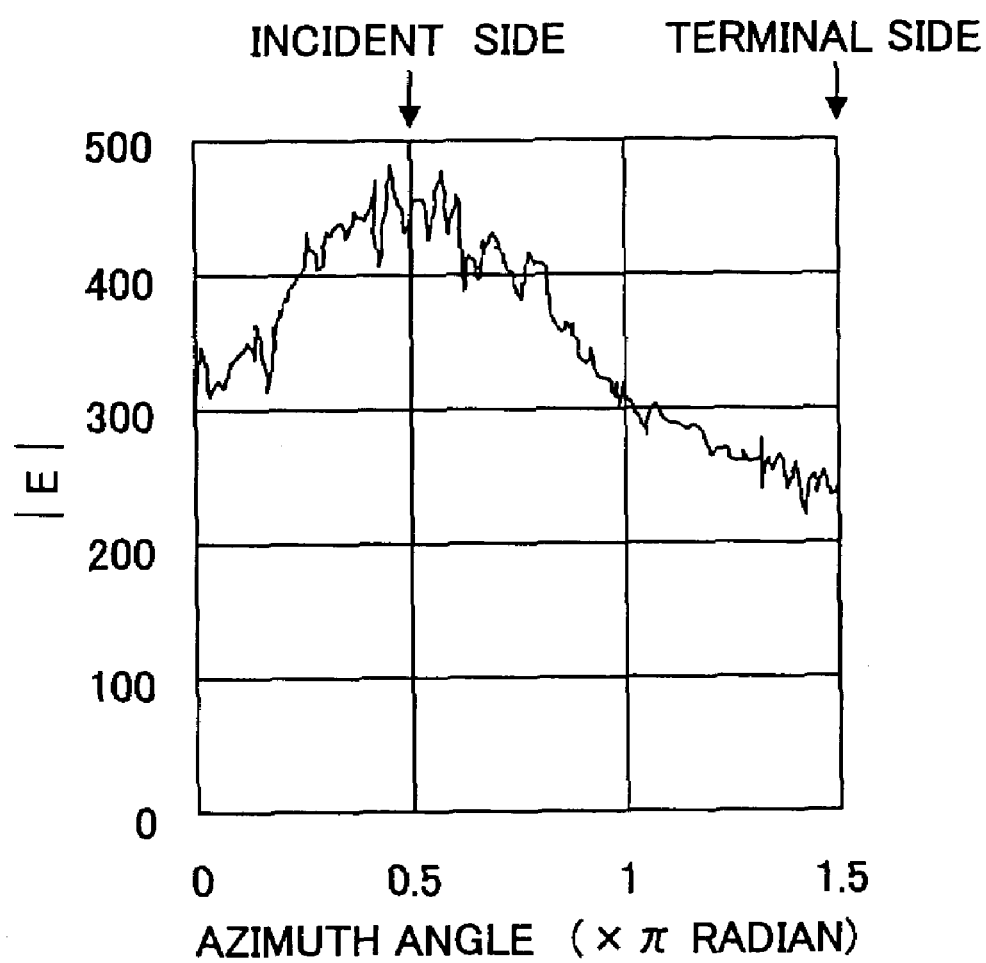
FIG. 10 is a graph showing the electric field strength of the microwave outlet opening in the circumferential direction thereof.

FIG. 10 is a graph showing the electric field strength distribution at the microwave outlet opening 22a in the circumferential direction thereof, wherein the vertical axis represents the electric field strength while the horizontal axis represents the azimuth angle. In the graph of FIG. 10, it should be noted that the edge part (incident side) of the microwave outlet opening 22a at the azimuth angle of $0.5\pi$ coincides with the microwave propagating direction and is located closest to the microwave generator 24. Further, the edge part (terminal side) of the microwave outlet opening 22a at the azimuth angle $1.5\pi$ coincides with the microwave propagating direction and is located farthest from the microwave generator 24. As can be seen from FIG. 10, the electric field strength becomes larger at the incident side edge part of the microwave outlet opening 22a corresponding to the azimuth angle of $0.5\pi$, while the electric field strength becomes smaller at the terminal side edge part of the microwave outlet opening 22a corresponding to the azimuth angle of $1.5\pi$.

When there is caused such deviation (asymmetry) in the electric field strength at the microwave outlet opening 22a, there is also caused a similar deviation in the microwave propagating in the antenna member 17 in the radial direction. Thereby, the intensity of the microwave emitted into the processing chamber becomes no longer uniform.

Thus, in the present embodiment, in order to eliminate such asymmetry of the microwave, the rectangular waveguide is formed in a symmetric shape with respect to the microwave outlet opening. Further, the present embodiment supplies the microwave from both sides of the microwave outlet opening.

Figure 11:
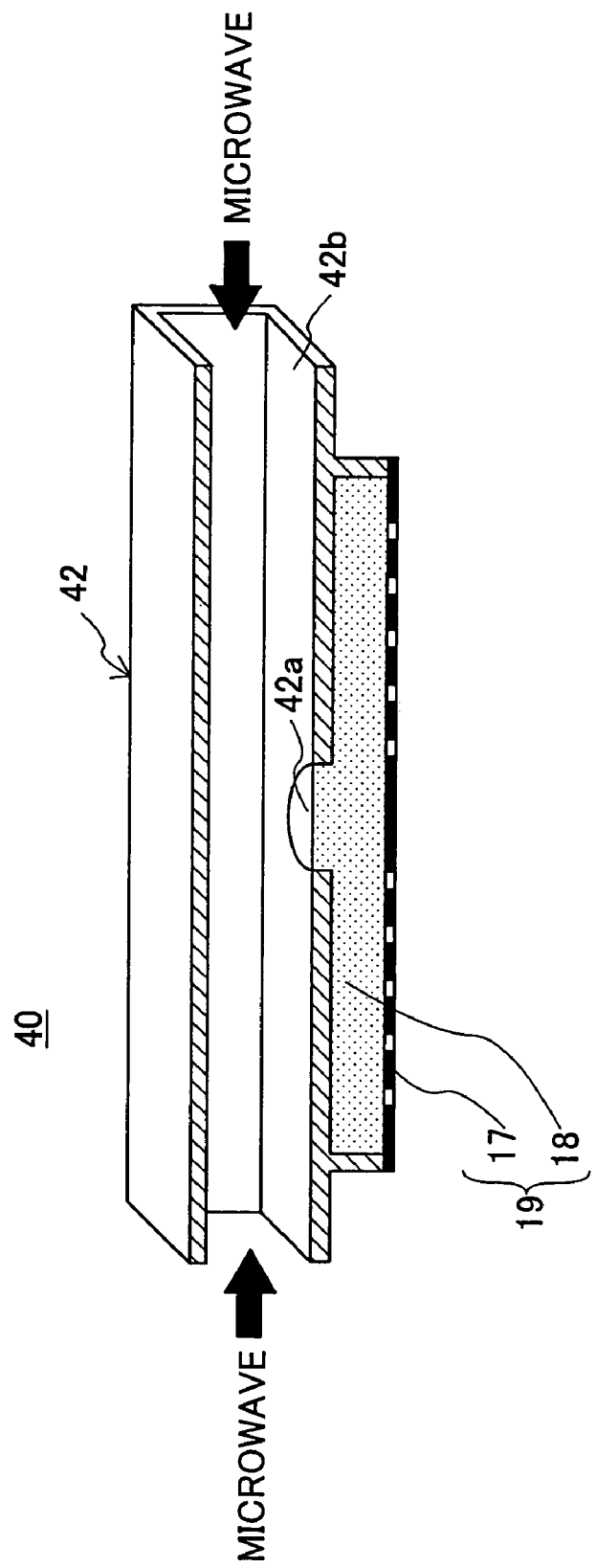
FIG. 11 is an oblique view showing the cross section of a microwave feeding apparatus of a microwave plasma processing apparatus according to a second embodiment.

FIG. 11 is an oblique view showing the cross section of the microwave feeding apparatus 40 of the plasma CVD apparatus according to the second embodiment.

As represented in FIG. 11, the rectangular waveguide 42 of the microwave feeding apparatus 40 is formed with a single microwave outlet opening 42a on a wall 42b thereof, and the microwave is supplied to the microwave-emitting member 19 from the microwave outlet opening 42a. Thereby, it should be noted that the rectangular waveguide 42 extends in the both directions of the microwave outlet opening 42a and there is formed a symmetrical structure with respect to the microwave outlet opening 42a.

In the microwave feeding apparatus 40 of such a construction, the microwave is supplied from both sides of the rectangular waveguide 42 and is outputted from the microwave outlet opening 42a. Thus, the microwave reaches the microwave outlet opening 42a from both sides of the microwave outlet opening 42a. Thereby, the phase of the microwave is controlled such that the microwaves propagating from both sides have the same phase at the microwave outlet opening 42a. For example, it is possible to supply the microwaves of the same phase to the microwave outlet opening 42a from both lateral sides by constructing the waveguide such that the microwave emitted from the same microwave generator is divided by a branched waveguide and reach the microwave outlet opening 42a with symmetrical paths.

Thus, in FIG. 11, the electric field strength of the microwave propagated from the right side at the incident side of the microwave outlet opening 42a and the electric field strength of the microwave propagated from the left side at the terminal side of the microwave outlet opening 42a cancel out with each other. Similarly, the electric field strength of the microwave propagated from the right side at the terminal side of the microwave outlet opening 42a and the electric field strength of the microwave propagated from the left side at the incident side of the microwave outlet opening 42a cancel out with each other. With this, the electric field strength of the microwave emitted from the microwave outlet opening 42a becomes uniform irrespective of the azimuth angle, and it becomes possible to emit a microwave of symmetric electric field to the microwave-emitting member 19.

In the foregoing embodiment, the rectangular waveguide 42 extends straight in right and left directions of the microwave outlet opening 42a. On the other hand, it is also possible to construct a cross-shaped rectangular waveguide in which the waveguide extends in four mutually perpendicular directions from the microwave outlet opening 42a. Further, it is possible to modify the microwave intensity distribution intentionally by supplying microwaves to the microwave outlet opening 42a from plural directions.

In the present embodiment, the asymmetry of the microwave electric field emitted from the microwave outlet opening is compensated for, by supplying the microwaves from plural directions to the microwave outlet opening. On the other hand, the deviation of the microwave is eliminated also in the construction in which the microwave is supplied only from one direction as in the case of the microwave feeding apparatus 20 of the first embodiment explained before, by modifying the shape of the microwave outlet opening from the circular shape to elliptical shape such as ellipse shape or oval shape.

(Third Embodiment)

Next, a third embodiment of the present invention will be explained. The microwave plasma processing apparatus according to the third embodiment has a fundamental construction identical with that of the plasma CVD apparatus of FIG. 1 except for the microwave feeding apparatus. Thus, only the microwave feeding apparatus will be explained hereinafter.

In the foregoing second embodiment, the deviation of microwave intensity distribution is eliminated by supplying the microwave from right and left directions. In the present invention, on the other hand, a microwave substantially free from deviation of electric field distribution to the microwave-emitting member, by providing a circular waveguide having a circular cross section between the rectangular waveguide connected to the microwave generator and the microwave emitting member.

Figure 12:
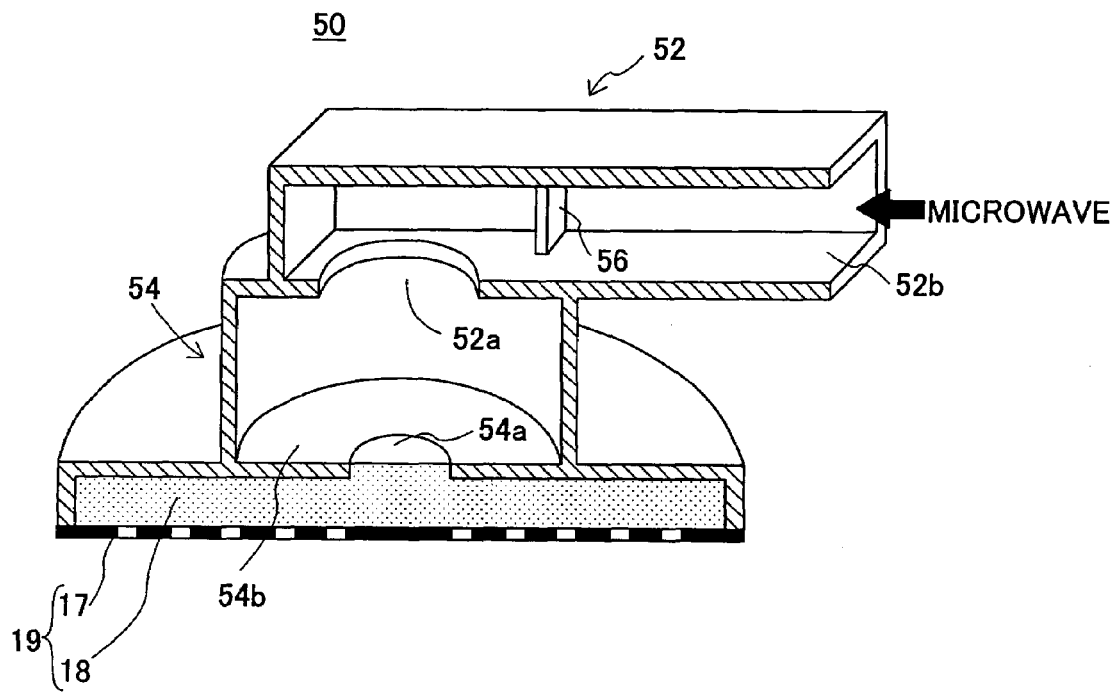
FIG. 12 is an oblique view showing the cross section of a microwave feeding apparatus of a microwave plasma processing apparatus according to a third embodiment of the present invention.

FIG. 12 is an oblique view showing the cross section of a microwave feeding apparatus 50 of a microwave plasma processing apparatus according to a third embodiment of the present invention.

As represented in FIG. 12, the microwave feeding apparatus 50 includes a circular waveguide 54 provided between the rectangular waveguide 52 and the microwave-emitting member 19. Further, there is provided a microwave outlet opening 52a on a wall 52 of the rectangular waveguide 52, and the microwave propagated through the rectangular waveguide 52 enters into the circular waveguide 54 through the microwave outlet opening 52a. The microwave thus introduced is emitted into the microwave-emitting member 19 from a microwave outlet opening 54a formed on a bottom part 54b of the circular waveguide. Thus, in the present embodiment, the axial direction (propagating direction of the microwave) of the rectangular waveguide 52 is perpendicular to the axial direction (propagating direction of the microwave) of the circular waveguide 54.

Figures 13A, 13B:
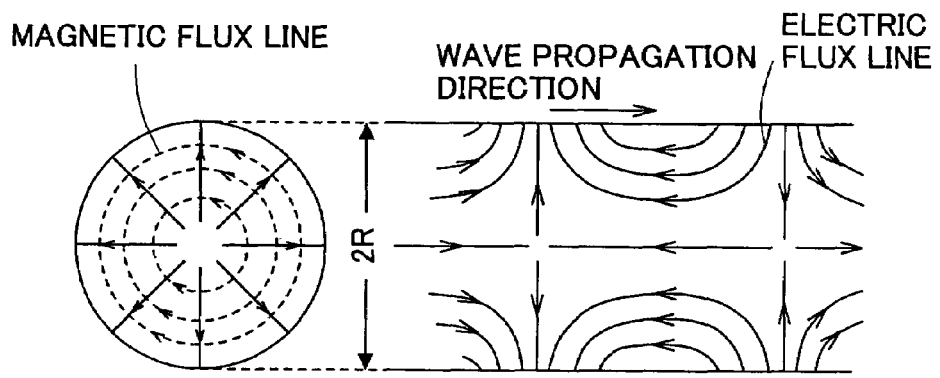
FIGS. 13A and 13B are diagrams explaining the propagation mode of the microwave in a circular waveguide.

Here, it should be noted that the microwave propagation mode in the circular waveguide is a TM01 mode in which the shape of the magnetic flux lines is similar to the one in the rectangular waveguide as shown in FIGS. 13A and 13B. Thus, in FIG. 13A, the magnetic flux lines are concentric and close to the TEM mode, which is the microwave propagation mode in a circular waveguide. Thereby, it can be seen that there is formed a uniform distribution in the circular cross section of the circular waveguide. Thus, by supplying a microwave from the circular waveguide 54 to the microwave-emitting member 19 via the circular microwave outlet opening 54a, it becomes possible to supply the microwave with uniform electric field distribution, and it becomes possible to emit the microwave to the processing chamber uniformly from the microwave-emitting member 19.

Here, it should be noted that the circular waveguide 54 functions as a cavity resonator by setting the length of the circular waveguide 54, in other words the distance from the outlet part of the microwave outlet opening 52a to the microwave outlet opening 54a, to be equal to n/2 times the microwave wavelength λg in the waveguide. Considering the effect of the size of the plasma processing apparatus or propagation loss, it is preferable to set the distance from the outlet part of the microwave outlet opening 52a to the microwave outlet opening 54a to be ½ times the microwave wavelength λg in the waveguide. In this case, the reflection from the circular waveguide 54 is reduced, and efficient supplying of the microwave to the antenna member 19 becomes possible.

Figure 14A:
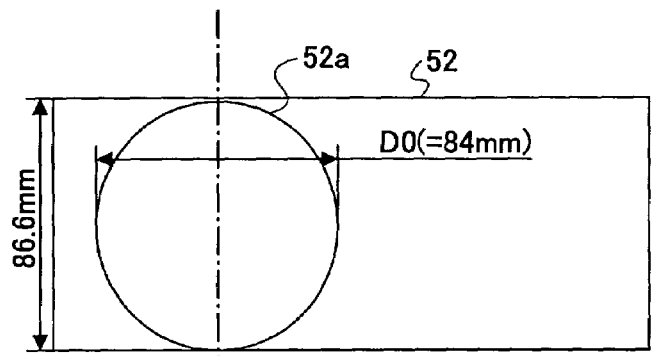
FIGS. 14A and 14B are diagrams showing the result of calculation of optimum size for various parts of the microwave feeding apparatus of FIG. 12 for the case a circular waveguide is used for the cavity resonator.
Figure 14B:
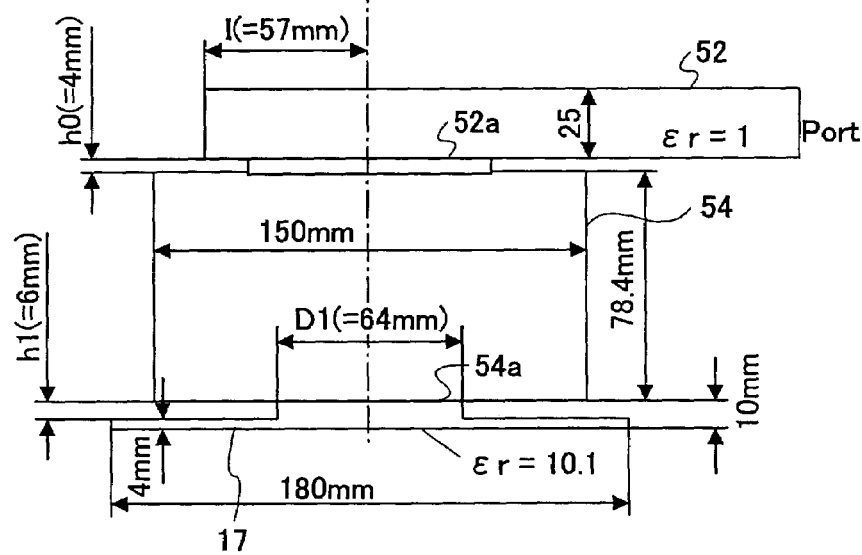

FIGS. 14A and 14B are diagrams showing the result of calculation of optimum size for various parts of the microwave feeding apparatus 50 of FIG. 12 for the case the circular waveguide 52 forms a cavity resonator, wherein it should be noted that FIG. 14A shows the rectangular waveguide 52 in a plan view while FIG. 14B shows the microwave feeding apparatus 50 in a side view.

In the present embodiment, the longer edge of the rectangular cross section of the rectangular waveguide 52 is set to 86.6 mm similarly to the first embodiment noted before, while the size of the shorter edge is set to 25 mm. Further, the diameter D0 of the microwave outlet opening 52a is set to 84 mm. Further, the size of the retardation plate 18 is set similarly to the size of the retardation plate 18 of the first embodiment such that the retardation plate 18 has a thickness of 4 mm and an outer size of 180 mm. It should be noted that the results shown below does not change even when the outer size is set to 180 mm or more. Further, the size of the connection part between the circular waveguide 54 and the retardation plate 18 is set similarly to the case of the connection part of the rectangular waveguide 22 and the retardation plate 18 in the first embodiment. Thus, the diameter D1 of the microwave outlet opening 54a of the circular waveguide 54 is set to 64 mm and the height (length) h1 of the microwave outlet opening 54a is set to 6 mm.

From the calculation based on the foregoing dimensions, it became possible to achieve efficient microwave feeding with low reflectance for the case the diameter of the circular waveguide 54 is set to 150 mm, the length of the circular waveguide is set to 78.4 mm and the length 1 from the center of the microwave outlet opening 52a of the rectangular waveguide 52 is set to 57 mm.

FIG. 15 is a graph showing the result of calculation of the microwave electric field distribution for the case the various parts of the microwave feeding apparatus are set to the foregoing dimensions.

From the graph of FIG. 15, it can be seen that the microwave electric field strength is generally uniform in all the azimuth directions.

Thus, according to the microwave feeding apparatus of the present invention, it becomes possible to supply a microwave of uniform electric field strength to the microwave-emitting member 19, and as a result, a microwave of uniform intensity is emitted into the processing vessel 12. With this, a uniform plasma processing becomes possible over the entire surface of the wafer W in the processing vessel, and a high-quality plasma processing is achieved.

Further, because the use of coaxial waveguide is eliminated at the time of supplying the microwave to the microwave-emitting member 19, it becomes possible to achieve efficient microwave supplying with small electric power loss, similarly to the first and second embodiments.

It should be noted that there is provided a compartment plate 56 inside the rectangular waveguide 52 shown in FIG. 12. It should be noted that this compartment plate 56 is provided for reflecting back the reflection wave returned from the microwave outlet opening 52a again to the microwave outlet opening 52a.

Further, it is possible to use any known converter or construction for introducing a microwave from the rectangular waveguide to the circular waveguide, and the present invention is not limited to those embodiments explained above.

INDUSTRIAL APPLICABILITY

Thus, according to the present invention, it becomes possible to supply a microwave to a microwave-emitting member without using a coaxial waveguide. Thus, the problem of electric power loss caused by the inner conductor of a coaxial waveguide is eliminated and the efficiency of electric power feeding is improved. Further, the number of locations that tend to invite concentration of microwave is reduced, and unwanted electric discharge in the power feeding part is reduced. Thereby, it becomes possible to supply a large electric power to the microwave-emitting member. Further, the screw connection part for connecting the inner conductor of a coaxial waveguide is no longer used. Thereby, the shape of the microwave-emitting member is simplified, and manufacturing thereof is facilitated. Further, as a result of simplification of shape of the microwave-emitting member, it becomes possible to provide a construction that confines helium conducting gas easily.

The invention claimed is:

1. A microwave plasma processing apparatus for applying plasma processing to a substrate, said apparatus comprising:
   a processing vessel accommodating therein a stage for supporting said substrate;
   a microwave generator;
   a waveguide connected to said microwave generator, said waveguide adapted to guide a microwave generated by said microwave generator;
   a microwave emitting member comprising a retardation plate disposed over a slot antenna member, adapted to emit said microwave into a space in said processing vessel after wavelength compression by the retardation plate; and
   a dielectric plate sealably mounted on an upper opening of said processing vessel, wherein said microwave emitting member is disposed over said dielectric plate and said slot antenna member is disposed over said dielectric plate, and
   wherein said waveguide has a portion having an outer surface that is in physical contact with said retardation plate and a respective inner surface opposed to and parallel to said outer surface that is exposed to microwaves, said portion of said waveguide being a rectangular waveguide and having a microwave outlet opening at a location corresponding to a center of said microwave emitting member.

2. A microwave plasma processing apparatus as claimed in claim 1, wherein said rectangular waveguide has a rectangular cross section.

3. A microwave plasma processing apparatus as claimed in claim 2, wherein said rectangular waveguide has a cross section such that a longer edge of said cross section has a length of ½ a wavelength of a microwave in said rectangular waveguide.

4. A microwave plasma processing apparatus as claimed in claim 2, wherein said microwave outlet opening of said rectangular waveguide is provided on a surface corresponding to a longer edge in a cross section of said rectangular wave guide.

5. A microwave plasma processing apparatus as claimed in claim 1, wherein said waveguide extends in plural directions about said microwave outlet opening.

6. A microwave plasma processing apparatus as claimed in claim 5, wherein said waveguide has a straight shape and is arranged symmetrically about said microwave outlet opening.

7. A microwave plasma processing apparatus as claimed in claim 1, further comprising another waveguide provided between said waveguide and said microwave emitting member with an axial direction perpendicular to an axial direction of said waveguide connected to said microwave generator, said microwave is supplied from said waveguide connected to said microwave generator to said another waveguide via said microwave outlet opening, said microwave being introduced into said microwave emitting member via another single microwave outlet opening provided on a bottom part of said another waveguide.

8. A microwave plasma processing apparatus as claimed in claim 7, wherein said another waveguide is a circular waveguide having a circular cross section.

9. A microwave plasma processing apparatus as claimed in claim 8, wherein said circular waveguide has a length equal to n/2 times (n being an integer) a wavelength of said microwave in said waveguide connected to said microwave generator, said circular waveguide forming a cylindrical cavity resonator.

10. A microwave plasma processing apparatus as claimed in claim 1, wherein said slot antenna member includes a number of slots penetrating there through in a thickness direction.

11. A microwave plasma processing apparatus as claimed in claim 10, wherein said slots of said slot antenna member are arranged in a spiral form or multiple circumferential form.

12. A microwave plasma processing apparatus as claimed in claim 11, wherein said slots of said microwave emitting slot antenna member form slot pairs each formed of two slots arranged in a T-shaped form.

13. A microwave plasma processing apparatus as claimed in claim 1, wherein a part of the retardation plate projects into the microwave outlet opening.

14. A microwave plasma processing apparatus as claimed in claim 1, wherein said microwave outlet opening is adapted such that microwaves emitted from said microwave outlet opening pass sequentially through said retardation plate, said antenna member, and said dielectric plate.

15. A microwave feeding apparatus for feeding a microwave into a processing chamber, said apparatus comprising:
   a waveguide connected to a microwave generator, said waveguide adapted to guide a microwave generated by said microwave generator; and
   a microwave emitting member adapted to propagate said microwave supplied at a central part thereof in a direction perpendicular to a direction in which said microwave is supplied, said microwave emitting member comprising an antenna member and a retardation plate, further adapted to emit said microwave into said processing chamber via a plurality of slots formed in the antenna member, wherein said waveguide has a portion having an outer surface that is in physical contact with said retardation plate and a respective inner surface opposed to and parallel to said outer surface that is exposed to microwaves, said portion of said waveguide being a rectangular waveguide and having a microwave outlet opening formed in a wall of said portion for outputting said microwaves.

16. A microwave feeding apparatus as claimed in claim 15, wherein said rectangular waveguide connected to said microwave generator has a rectangular cross section.

17. A microwave feeding apparatus as claimed in claim 16, wherein said rectangular waveguide has a cross section such that a longer edge of said cross section has a length of ½ of a wavelength of a microwave in said rectangular waveguide.

18. A microwave feeding apparatus as claimed in claim 16, wherein said microwave outlet opening of said rectangular waveguide is provided on a surface that forms a longer edge in a cross section of said rectangular wave guide.

19. The microwave feeding apparatus as claimed in claim 15, wherein said rectangular waveguide connected to said microwave generator extends in plural directions about said microwave outlet opening.

20. The microwave feeding apparatus as claimed in claim 19, wherein said rectangular waveguide connected to said microwave generator has a straight shape and extends symmetrically with respect to said microwave outlet opening.

21. The microwave feeding apparatus as claimed in claim 15, wherein another waveguide is provided between said waveguide connected to said microwave generator and said microwave emitting member with an axial direction perpendicular to an axial direction of said waveguide connected to said microwave generator, wherein said microwave is supplied from said waveguide connected to said microwave generator to said another waveguide via said microwave outlet opening, said microwave being introduced into said microwave emitting member via another single microwave outlet opening provided on a bottom part of said another waveguide.

22. A microwave feeding apparatus as claimed in claim 21, wherein said another waveguide is a circular waveguide having a circular cross section.

23. A microwave feeding apparatus as claimed in claim 22, wherein said circular waveguide has a length equal to n/2 times (n being an integer) a wavelength of said microwave in said waveguide connected to said microwave generator, said circular waveguide forming a cylindrical cavity resonator.

24. A microwave feeding apparatus as claimed in claim 15, comprising said retardation plate disposed between said microwave outlet opening and said antenna member.

25. A microwave feeding apparatus as claimed in claim 24, wherein said microwave outlet opening is adapted such that microwaves emitted from said microwave outlet opening pass sequentially through said retardation plate and said antenna member.

26. A microwave feeding apparatus as claimed in claim 15, wherein said antenna member includes a number of slots penetrating there through in a thickness direction.

27. A microwave feeding apparatus as claimed in claim 26, wherein said slots of said antenna member are arranged in a spiral form or multiple circumferential form.

28. A microwave feeding apparatus as claimed in claim 27, wherein said slots of said antenna member form slot pairs each formed of two slots arranged in a T-shaped form.

29. A microwave feeding apparatus as claimed in claim 15, wherein a part of the retardation plate projects into the microwave outlet opening.

* * * * *